United States Patent [19]

Crivello

[11] Patent Number: 4,603,101

[45] Date of Patent: Jul. 29, 1986

[54] PHOTORESIST COMPOSITIONS CONTAINING T-SUBSTITUTED ORGANOMETHYL VINYLARYL ETHER MATERIALS

[75] Inventor: James V. Crivello, Clifton Park, N.Y.

[73] Assignee: General Electric Company, Schenectady, N.Y.

[21] Appl. No.: 780,768

[22] Filed: Sep. 27, 1985

[51] Int. Cl.$^4$ ................................................ G03C 1/76
[52] U.S. Cl. ..................................... 430/270; 430/280; 430/281; 430/325; 430/326; 522/150; 522/152; 522/154; 522/155
[58] Field of Search ............... 522/152, 154, 155, 150; 430/270, 280, 281, 325, 326

[56] References Cited

U.S. PATENT DOCUMENTS 4,491,628 1/1985 Ito et al. ............................... 430/176

Primary Examiner—Jack P. Brammer
Attorney, Agent, or Firm—William A. Teoli; James C. Davis, Jr.; James Magee, Jr.

[57] ABSTRACT t-Butylvinylaryl ethers are provided which can be used to make t-butyl substituted polyaryl ethers and photoresist compositions. The photoresist compositions can be made by combining the t-butylpolyaryl ethers with aromatic onium salts.

5 Claims, No Drawings

PHOTORESIST COMPOSITIONS CONTAINING T-SUBSTITUTED ORGANOMETHYL VINYLARYL ETHER MATERIALS

BACKGROUND OF THE INVENTION

Various photosensitive polymers, as shown by Merrill U.S. Pat. No. 2,948,610, directed to azide polymers, Minsk U.S. Pat. No. 2,725,372, directed to unsaturated esters of polyvinyl alcohol, Eastman Kodak photoresist KPR and KMER have been used in combination with various photosensitizers to effect the cross-linking of the polymer when exposed to UV radiation.

Ito et al. U.S. Pat. No. 4,491,628 shows the use of a polymer, such as polystyrene having recurring pendant groups such as t-butyl ester or t-butyl carbonates in combination with a photoinitiator. Exposure to UV radiation generates acid which converts the styryl t-butyl ester or styryl t-butyl carbonate to the corresponding base soluble phenol. A sensitizer altering the wave-length of the sensitizer also can be added to the photoresist. Although the positive or negative photoresist compositions of Ito et al. provide particular advantages over the photoresists of the prior art, it has been found that exposure of poly-t-butoxycarbonyloxy styrene, or the corresponding poly-t-butoxycarbonyloxy-α-methylstyrene to UV radiation results in the production of both carbon dioxide and isobutylene, an excessive amount of gaseous by-products. It would be desirable to have positive or negative photoresist compositions, resulting from the use of polymeric materials which are either convertible to aqueous base soluble products, or products soluble in a mixture of n-hexane and methylene chloride, which do not generate excessive amounts of gaseous by-products.

The present invention is based on my discovery that t-substituted organomethyl vinylaryl ethers such as t-butylvinylaryl ethers having the formula

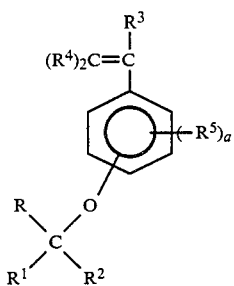

where R is a monovalent radical selected from the class consisting of $C_{(1-8)}$ alkyl radicals and $C_{(6-14)}$ aryl radicals, $R^1$ and $R^2$ are the same or different $C_{(1-8)}$ monovalent alkyl radicals, $R^3$ is a monovalent radical selected from hydrogen and $C_{(1-3)}$ alkyl, and $R^4$ is a monovalent radical selected from hydrogen, $C_{(1-3)}$ alkyl and mixtures thereof, $R^5$ is selected from the same or different $C_{(1-8)}$ alkyl radicals, Cl, Br, $NO_2$, CN, $C_{(1-8)}$ alkoxy and $C_{(1-8)}$ alkyl ester and a is equal to 0 to 2 inclusive, can be polymerized and the resulting polymer can be utilized as a photoresist when combined with an effective amount of an aryl onium salt as defined hereinafter. The resulting photoresist can be converted to a positive photoresist having a plurality of chemically combined units of the formula

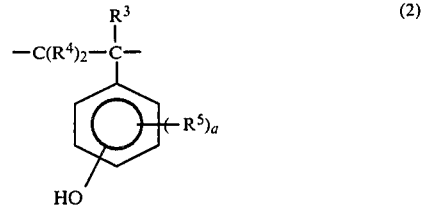

where $R^3$, $R^4$, $R^5$ and a are as previously defined. Advantageously, the generation of the base soluble polymer consisting essentially of chemically combined units of formula (2) can result in the production of an unsaturated olefin, such as isobutylene without the generation of additional amounts of gaseous by-products, such as carbon dioxide formed in the photoresist method of Ito et al.

STATEMENT OF THE INVENTION

There is provided by the present invention, a photoresist composition comprising (A) a polystyrene consisting essentially of chemically combined units of the formula

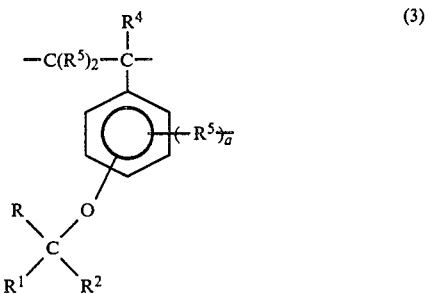

(B) an effective amount of a cationic photoinitiator, (C) from 10 to 95 parts of an inert organic solvent, per part of (A), where R, $R^1$, $R^2$, $R^3$, $R^4$ and $R^5$ and a are as previously defined.

Monovalent alkyl radicals which are included within R, $R^1$, $R^2$ and $R^5$ are, for example, methyl, ethyl, propyl, butyl, pentyl, hexyl; monovalent radicals which are included within $R^3$ and $R^4$ are, for example, hydrogen, or $C_{(1-3)}$ alkyl radicals included within R. In addition, R can be phenyl, tolyl, xylyl or substituted members thereof while $R^5$ can be methoxy, ethoxy, carbethoxy, etc.

Cationic photoinitiators which can be utilized in the practice of the present invention are, for example, diaryliodonium salts such as

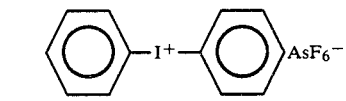

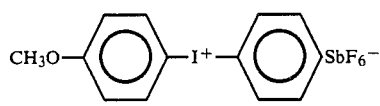

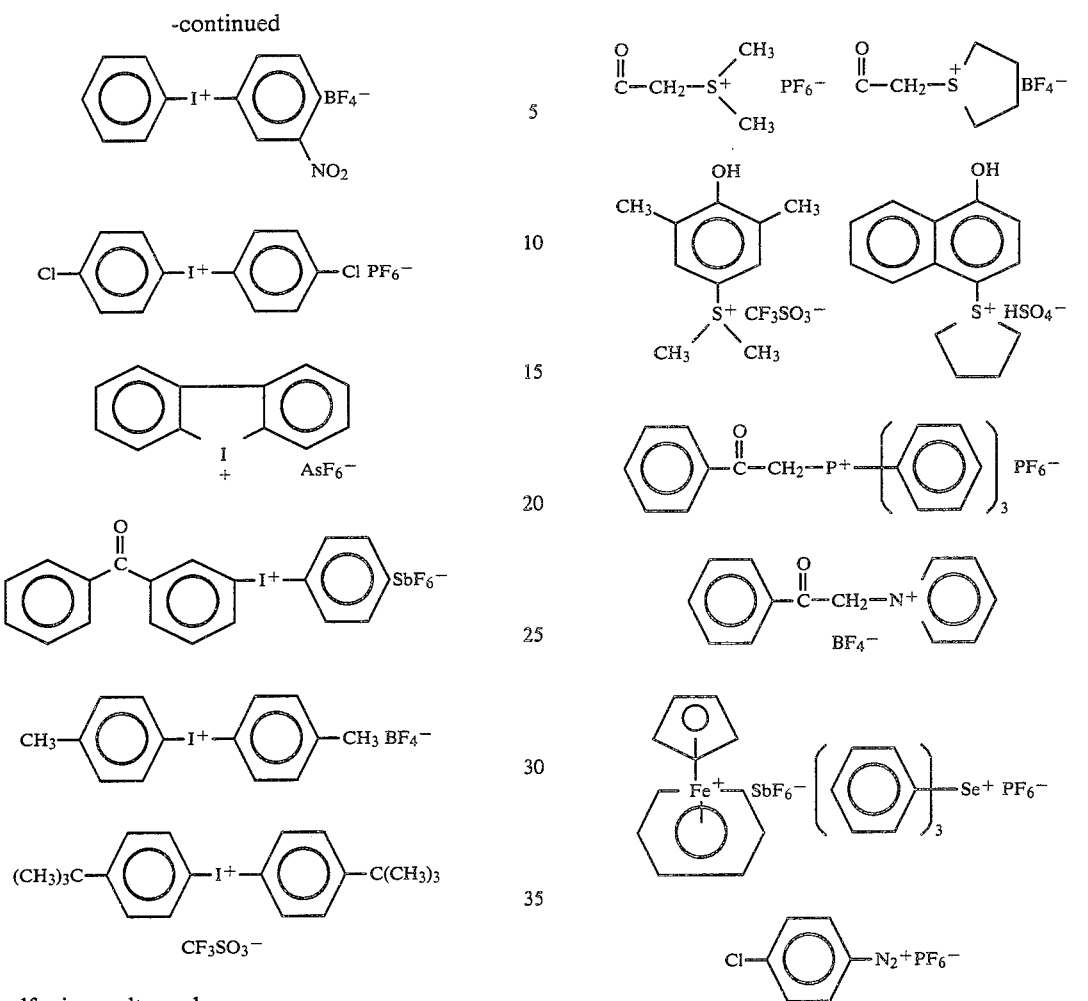

Aryl sulfonium salts such as

Additional cationic photoinitiators which can be utilized in the practice of the present invention are, for example, An effective amount of photoinitiator is from 0.5% to 20% by weight of photoinitiator based on the total weight of photoresist composition of (A), (B) and (C) of the Statement of the Invention.

Some of the t-butylvinylaryl ethers included within formula (1) are, for example, A convenient procedure for making the t-butylarylvinyl ethers of formula (1) is, for example,

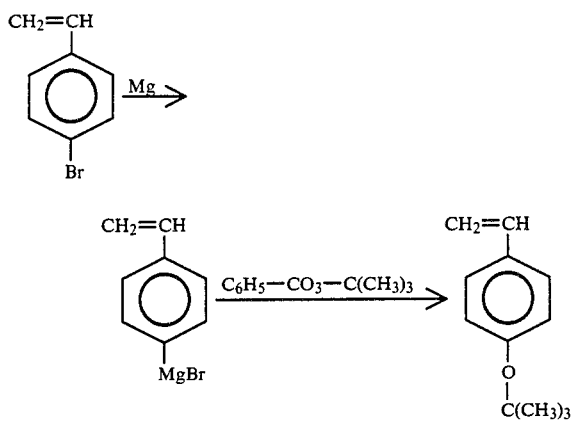

Polymerization of the t-butylvinylaryl ethers of formula (1) to polymers consisting essentially of chemically combined units of formula (3) can be achieved by use of an effective amount of a polymerization catalyst such as benzoyl peroxide, 2,2'-azobisisobutyronitrile, lauroyl peroxide, dicumyl peroxide, t-butylperoxypivalate, propionyl peroxide. An effective amount of polymerization catalyst is from 0.1% to 5% by weight of catalyst, based on the weight of catalyst and t-butylvinylaryl ether within the scope of formula (1). Polymerization of the t-butylvinylaryl ether of formula (1) can be achieved at temperatures in the range of from 25° C. to 180° C. under an inert atmosphere such as nitrogen or noble gas in the presence of an inert organic solvent. Suitable inert organic solvents are, for example, benzene, toluene, water, ethanol, cyclohexane, xylene, chlorobenzene, dimethylformamide, isopropyl alcohol.

Suitable inert organic solvents which can be used in combination with the photoresist compositions of the present invention consisting essentially of chemically combined units of formula (3) are, for example, 1,2-dimethoxy ethane, cellosolve acetate, cyclohexanone, propylene glycol methylether acetate, chlorobenzene, diglyme, methylene chloride, 1,2-dichloroethane, dioxane.

In particular instances, sensitizers can be used in combination with the photoresist consisting essentially of chemically combined units of formula (3) to alter the spectral response of the photoresist to longer wavelengths. These sensitizers can be utilized in amounts of from 0.025% to 5% by weight, based on the weight of the photoresist composition of the polystyrene consisting essentially of chemically combined units of formula (3), the photoinitiator and the organic solvent. Some of these sensitizers are, for example, acridine orange, benzoflavin, anthracene, perylene, ruberene, benzophenone, anthraquinone, chrysene, acridine yellow, 9,10-diphenyl anthracene, 9-ethoxy anthracene, Mitchlers ketone, pyrene, anthrone, thioxanthone.

It has been found that effective results can be achieved with the photoresist compositions of the present invention when using ultraviolet light at a wavelength of 227 nanometers to 600 nanometers. However, in particular instances electron beam or X-ray radiation also can be used. In instances where a negative photoresist is desired, a mixture of organic solvent can be used such as n-hexane and methylene chloride in place of of a dilute aqueous base after the photoresist has been applied to a suitable substrate by a standard spin casting technique and irradiated to effect the liberation of the acid catalyst.

In order that those skilled in the art will be better able to practice the invention, the following examples are given by way of illustration and not by way of limitation. All parts are by weight.

EXAMPLE 1

There was added dropwise with vigorous stirring under a nitrogen atmosphere, 62.9 grams (0.34 mole) of 4-chlorostyrene and 250 ml. of dry distilled tetrahydrofuran to 8.9 grams (0.37 mole) of magnesium metal turnings under enough tetrahydrofuran to cover the turnings. The exothermic reaction was controlled by external cooling to keep the temperature below 60° C. After the exotherm had subsided, the reaction mixture was heated at 60° C. for 0.5 hour until most of the magnesium had been consumed. Using a salt-ice bath, the reaction mixture was cooled to 0° C. and a solution of 44 grams (0.23 mole) of t-butyl perbenzoate in 80 ml. of tetrahydrofuran was added a such a rate to maintain the temperature between 0° C. and 5° C. After the addition had been completed, the temperature was allowed to rise to 25° C. with stirring over the course of 2 hours. Reaction mixture was then poured into 1000 ml. of a 3% aqueous hydrochloric acid solution. The oil which formed was extracted from the aqueous solution with 200 ml. portions of ethylether. The ether layers were washed twice with a 10% aqueous sodium hydroxide solution and then with water until the washings were neutral. The ether layer was then dried over sodium sulfate and the ether removed using a rotary evaporator. To the pale-yellow oil which remained was added a small amount of ionol as an inhibitor and the product fractionally distilled. There was obtained 20% yield of 4-t-butoxystyrene having a boiling point of 45°–46° C. at 0.03 millimeters. The proton NMR spectrum was recorded and is in agreement with the structure of the product. Elemental analysis calculated for $C_{12}H_{16}O$: %C, 81.82; %H, 9.09. Found: %C, 81.64; %H, 8.89.

A solution of 0.03 grams of 2,2'-azobisisobutyronitrile in 5 grams of the above 4-t-butoxystyrene was sealed in a container after the solution had been purged with nitrogen. The mixture was heated under sealed conditions at 70° C. for 18 hours. There was obtained a solid material which was dissolved in methylene chloride and precipitated into methanol. The product was chopped into small pieces and washed with methanol and dried in vacuo for 12 hours at 80° C. There was obtained 4.76 grams of product which was a 95.2% yield. Based on method of preparation and GPC analysis in methylene chloride the product was a poly-4-t-butoxystyrene having an $M_n$ equal to 181,500 g/mole and a $M_w$ equal to 437,000 g/mole. The polymer had a glass transition temperature of 103° C.

EXAMPLE 2

The procedure of Example 1 was repeated, except that there was utilized 16.9 grams (0.70 mole) of magnesium metal and 100 grams (0.66 mole) of 4-chloro-α-methylstyrene dissolved in 200 ml. of tetrahydrofuran. The Grignard reaction was started by the addition of a small amount of methyl iodide. After the reaction mixture had been refluxed for 12 hours, there was added at 0° C. in a dropwise manner a solution of 85 grams of t-butylperbenzoate in 300 ml. of ethylether. A crystalline product identified as 4,4'-diisopropenylbiphenyl was isolated from the oil which was recovered by filtering the mixture and washing with methanol. After stripping the methanol, a 69.3% yield of 4-t-butoxy-α-methylstyrene was isolated by fractional distillation as a colorless liquid having a boiling point of 65°–68° C. at 0.03 millimeters.

Cationic polymerization of the 4-t-butoxy-α-methylstyrene was achieved under sealed conditions in a nitrogen atmosphere with 3.5 grams of the 4-t-butoxy-α-methylstyrene, 1 ml. of 1,2-dichloroethane and 0.04 grams of 4-methoxydiphenyliodonium hexafluorophosphate. The mixture was cooled to −28° to −50° C. and irradiated using a 450 watt Hanovia medium pressure mercury arc lamp for 1 hour. After irradiation, the viscous polymer mixture was allowed to stand for 0.5 hours at −30° C. and then precipitated into methanol. The polymer was filtered, washed with methanol and then dried in vacuo to give 0.8 gram of poly-4-t-butoxy-α-methylstyrene having an $M_n$ equal to 10,173 g/mole and an $M_w$ equal to 15,495 g/mole.

EXAMPLE 3

Example 1 was repeated in all respects, except that 3-bromostyrene was substituted for 4-bromostyrene. The product, 3-t-butoxystyrene was purified by fractional distillation and the pure monomer which boiled at 50°–52° C. at 0.05 millimeters was used in the subsequent polymerization. A mixture of 0.36 g 2,2′-azobisisobutyronitrile and 15.0 g 3-t-butoxystyrene were sealed under nitrogen in a polymerization flask. Polymerization was conducted at 70° C. for 18 hours. The polymer was isolated as described in Example 1.

EXAMPLE 4

A solution consisting of 0.5 grams of poly-4-t-butoxystyrene, 0.1 gram of di(t-butylphenyl)iodonium trifluoromethane sulfonate and 7 ml. of glyme was spin coated onto several 3 inch diameter silicon wafers. The wafers were then baked for 30 minutes at 100° C. and then printed using a metal contact mass and a GE H3T7 medium pressure mercury arc lamp. Irradiation for 2 seconds was followed by a post bake at 100° C. for 5 seconds. The wafers were developed by immersing them in 1.6N NaOH for 1 minute. There was obtained clear, well defined positive images.

The same procedure was repeated, except a photoresist was used employing poly-4-p-butoxy-α-methylstyrene. There was obtained positive tone images by first irradiating the silicon wafers for 5 seconds followed by a 10 second post bake at 100° C. and development in 1.6 normal NaOH for 1 minute.

EXAMPLE 5

A photoresist solution was prepared containing 0.5 grams of poly-4-t-butoxystyrene, 0.2 gram of di(4-t-butylphenyl)iodonium hexafluoroantimonate, 0.0037 grams of perylene and 5 ml. of glyme. The solution was spin coated onto 4 inch diameter silicon wafers and baked for 30 minutes at 100° C. The wafers were exposed using a Perkin Elmer 111 projection aligner with a multidensity mask. The wafers were developed in a negative mode using a 3:1 mixture of n-hexane and chloroform. The best results were obtained at a scanning rate of 320. Lines down to 1.5 microns were resolved with good clearing in the 2.5 micron lines.

Although the above examples are directed to only a few of the very many variables which can be employed in making the photoresist compositions as well as the alkenylaryl ethers and polymers obtained therefrom, it should be understood that the present invention is directed to a much broader variety of photoresist compositions as well as the alkenylaryl ether materials used in making such compositions as shown in the description preceding these examples.

What I claim as new and desire to secure by Letters Patent of the United States is:

1. A photoresist composition comprising
   (A) a polystyrene consisting essentially of chemically combined units of the formula

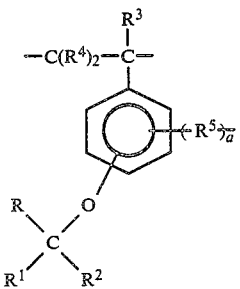

(B) an effective amount of a cationic photoinitiator,
   (C) from 10 to 95 parts of an inert organic solvent per part of (A),
   where R is a monovalent radical selected from the class consisting of $C_{(1-8)}$ alkyl radicals and $C_{(6-14)}$ aryl radicals, $R^1$ and $R^2$ are the same or different $C_{(1-8)}$ monovalent alkyl radicals, $R^3$ is a monovalent radical selected from hydrogen and $C_{(1-3)}$ alkyl, and $R^4$ is a monovalent radical selected from hydrogen, $C_{(1-3)}$ alkyl and mixtures thereof, $R^5$ is selected from the same or different $C_{(1-8)}$ alkyl radicals, Cl, Br, $NO_2$, CN, $C_{(1-8)}$ alkoxy and $C_{(1-8)}$ alkyl ester and a is equal to 0 to 2 inclusive.

2. A photoresist composition in accordance with claim 1, wherein the polymer consists of chemically combined 4-t-butoxystyrene units.

3. A photoresist composition in accordance with claim 1, where the polymer consists of chemically combined 4-t-butoxy-α-methylstyrene units.

4. A photoresist composition in accordance with claim 1, utilizing diaryliodonium salt as the photoinitiator.

5. A photoresist composition in accordance with claim 1, using a triarylsulfonium salt as the photoinitiator.

* * * * *